(12) United States Patent
Jin et al.

(10) Patent No.: US 12,256,608 B2
(45) Date of Patent: Mar. 18, 2025

(54) DISPLAY PANEL AND DISPLAY APPARATUS

(71) Applicant: KUNSHAN GO-VISIONOX OPTO-ELECTRONICS CO., LTD, Jiangsu (CN)

(72) Inventors: Yu Jin, Kunshan (CN); Enlai Wang, Kunshan (CN); Rulong Li, Kunshan (CN); Jijun Jiang, Kunshan (CN); Wangfeng Xi, Kunshan (CN); Penghui Zhang, Kunshan (CN); Teng Ren, Kunshan (CN); Yunlei Lu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 427 days.

(21) Appl. No.: 17/673,497

(22) Filed: Feb. 16, 2022

(65) Prior Publication Data

US 2022/0173185 A1 Jun. 2, 2022

Related U.S. Application Data

(63) Continuation of application No. PCT/CN2020/132864, filed on Nov. 30, 2020.

(30) Foreign Application Priority Data

Jan. 2, 2020 (CN) .......................... 202010003325.0

(51) Int. Cl.
*H01L 27/32* (2006.01)
*H01L 51/52* (2006.01)
(Continued)

(52) U.S. Cl.
CPC ......... *H10K 59/123* (2023.02); *H10K 50/816* (2023.02); *H10K 71/00* (2023.02);
(Continued)

(58) Field of Classification Search
CPC .... H10K 59/131; H10K 59/65; H10K 59/123; H10K 59/1213; H10K 59/80517;
(Continued)

(56) References Cited

U.S. PATENT DOCUMENTS

2021/0043135 A1* 2/2021 Zhao ................... G09G 3/3266
2021/0193758 A1* 6/2021 Choi ................... H10K 59/123

FOREIGN PATENT DOCUMENTS

| CN | 1575063 A | 2/2005 |
|---|---|---|
| CN | 109801950 A | 5/2019 |

(Continued)

OTHER PUBLICATIONS

International Search Report issued on Mar. 3, 2021 in corresponding International Application No. PCT/CN2020/132864; 4 pages.
(Continued)

*Primary Examiner* — Shahed Ahmed
*Assistant Examiner* — Rhys Poniente Sheker
(74) *Attorney, Agent, or Firm* — Maier & Maier, PLLC (57) ABSTRACT

A display panel and a display apparatus. The display panel includes a first display region and a second display region, an array substrate, a plurality of light-emitting structures, a plurality of pixel driver circuits and at least one isolation structure. The first display region is disposed around at least a portion of the second display region, and the second display region corresponds to a photosensitive device configured to collect light through the second display region. The plurality of light-emitting structures are located on the array substrate and disposed in both the first display region and the second display region. The plurality of pixel driver circuits are disposed in the array substrate, and the plurality of pixel driver circuits are disposed in one-to-one correspondence with the plurality of light-emitting structures.

19 Claims, 3 Drawing Sheets

(51) Int. Cl.
  *H01L 51/56* (2006.01)
  *H10K 50/816* (2023.01)
  *H10K 59/123* (2023.01)
  *H10K 71/00* (2023.01)
  *H10K 59/12* (2023.01)
  *H10K 102/00* (2023.01)
  *H10K 102/10* (2023.01)

(52) U.S. Cl.
  CPC ... *H10K 59/1201* (2023.02); *H10K 2102/103* (2023.02); *H10K 2102/351* (2023.02)

(58) Field of Classification Search
  CPC ............. H10K 59/1315; H10K 50/813; H10K 50/816; H10K 71/00

See application file for complete search history.

(56) References Cited

FOREIGN PATENT DOCUMENTS

| | | |
|---|---|---|
| CN | 109994536 A | 7/2019 |
| CN | 110034152 A | 7/2019 |
| CN | 110112184 A | 8/2019 |
| CN | 110148621 A | 8/2019 |
| CN | 110491917 A | 11/2019 |
| CN | 210245502 U | 4/2020 |
| CN | 111162199 A | 5/2020 |
| KR | 20190074859 A | 6/2019 |

OTHER PUBLICATIONS

First Office Action issued on Jan. 28, 2021 in corresponding Chinese Application No. 202010003325.0; 17 pages.
Second Office Action issued on Jun. 10, 2021 in corresponding Chinese Application No. 202010003325.0; 12 pages.

* cited by examiner

DISPLAY PANEL AND DISPLAY APPARATUS

CROSS-REFERENCE TO RELATED APPLICATION

This is a continuation of International Patent Application No. PCT/CN2020/132864, filed on Nov. 30, 2020, which is based on and claims priority to a Chinese Patent Application No. CN202010003325.0 filed on Jan. 2, 2020, disclosures of which are incorporated herein by reference in their entireties.

TECHNICAL FIELD

Embodiments of the present disclosure relate to the field of display technologies, for example, to a display panel and a display apparatus.

BACKGROUND

With the rapid development of electronic devices, users have increasingly higher requirements for the screen-to-body ratio, so that full screens of electronic devices attract more and more attention in the industry. Electronic devices such as mobile phones and tablet computers need to integrate front-facing cameras, receivers, and infrared sensing elements, so that their display screens can be notched, and cameras, receivers and infrared sensing elements are disposed in the notched regions. However, the display screens of these electronic devices are not full screens in the true sense and cannot perform display in all regions of the entire screen. For example, images cannot be displayed in a camera region.

To achieve true full screens, the under-screen camera technology has emerged, that is, the technology through which a region provided with a photosensitive device in a display screen can still be used for display. However, the sputtering film forming process for forming transparent anodes in the region where the photosensitive device is disposed will affect light emission characteristics of light-emitting structures in a normal display region, and further affect the display effect of the normal display region of the display panel.

SUMMARY

The present application provides a display panel and a display apparatus. The light emission effect of light-emitting structures in a first display region is optimized, and thus the display effect of the first display region of the display panel is optimized.

Embodiments of the present application provide a display panel. The display panel includes a first display region and a second display region, an array substrate, a plurality of light-emitting structures, a plurality of pixel driver circuits and at least one isolation structure.

The first display region is disposed around at least a portion of the second display region, and the second display region corresponds to a photosensitive device configured to collect light through the second display region.

The plurality of light-emitting structures are located on the array substrate and disposed in both the first display region and the second display region, and each of the plurality of light-emitting structures includes an anode and an opening region.

The plurality of pixel driver circuits are disposed in the array substrate and disposed in one-to-one correspondence with the plurality of light-emitting structures.

The at least one isolation structure is disposed in the first display region, each of the at least one isolation structure is disposed and conductively connected between the anode of a corresponding one of the plurality of light-emitting structures and a corresponding one of the plurality of pixel driver circuits; and in the opening region of each of the plurality of light-emitting structures, each of the at least one isolation structure covers the anode of the corresponding one of the plurality of light-emitting structures along a first direction perpendicular to the display panel.

The embodiments of the present application further provide a display apparatus.

The display apparatus includes the display panel described above.

The embodiments of the present application provide a display panel and a display apparatus. The display panel includes a first display region and a second display region. The first display region is disposed around at least a portion of the second display region, the second display region is correspondingly provided with a photosensitive device, and the photosensitive device is configured to collect light through the second display region. The display panel further includes an array substrate and a plurality of light-emitting structures located on the array substrate and disposed in the first display region and the second display region. A plurality of pixel driver circuits are disposed in the array substrate, and the plurality of pixel driver circuits are disposed in one-to-one correspondence with the plurality of light-emitting structures. The display panel further includes at least one isolation structure. The at least one isolation structure is disposed in the first display region, each of the at least one isolation structure is disposed and conductively connected between the anode of a corresponding one of the plurality of light-emitting structures and a corresponding one of the plurality of pixel driver circuits and in the opening region of each of the plurality of light-emitting structures, each of the at least one isolation structure covers the anode of the corresponding one of the plurality of light-emitting structures along a first direction perpendicular to the display panel. In this way, the opening regions of the plurality of light-emitting structures achieve effective isolation between anodes in the first display region and a planarization layer through the plurality of isolation structures, so that the light-emitting effect of the plurality of light-emitting structures in the first display region is optimized, and the display effect of the first display region of the display panel is improved.

DETAILED DESCRIPTION

To facilitate a better understanding of the present application, a description of the present application is provided below with reference to the drawings. The drawings illustrate embodiments of the present application. However, the present application may be implemented in many different forms and is not limited to the embodiments described herein.

To ensure that the region provided with a photosensitive device in a display panel has sufficient light transmission rate, transparent anodes on a planarization layer in this region is needed. The transparent anodes are formed after the magnetron sputtering process and the etching process on the entire surface of the display panel. However, after this step, the material of transparent anodes is also formed on a planarization layer in a normal display region not provided with the photosensitive device, and the sputtering film forming process for forming the transparent anodes will affect physical and chemical characteristics of the surface of the planarization layer in the normal display region. As a result, when anodes in the normal display region are deposited on the planarization layer, a migration phenomenon of the anodes in the normal display region exists, which affects light emission characteristics of light-emitting structures in the normal display region, and then affects the display effect of the normal display region of the display panel.

In the embodiments of the present application, at least one isolation structure is disposed in the first display region, each of the at least one isolation structure is disposed and conductively connected between the anode of a corresponding one of the a plurality of light-emitting structures and a corresponding one of the a plurality of pixel driver circuits, and in the opening region of each of the a plurality of light-emitting structures, each of the at least one isolation structure covers the anode of the corresponding one of the a plurality of light-emitting structures along a first direction perpendicular to the display panel. In this way, the opening regions of the a plurality of light-emitting structures achieve effective isolation between anodes and a planarization layer in the first display region via the at least one isolation structure, and the problem is avoided that the manufacturing process of anodes in a second display region causes the change of physical and chemical characteristics of the surface of the planarization layer in the first display region, thereby causing abnormal migration of anodes in positions of the opening regions of the light-emitting structures and above the planarization layer. Further, the impact of the change of the physical and chemical characteristics of the surface of the planarization layer in the first display region on light emission characteristics of the light-emitting structures in the first display region is avoided, the light emission effect of the light-emitting structures in the first display region is optimized, and thus the display effect of the first display region of the display panel is optimized.

Figure 1:
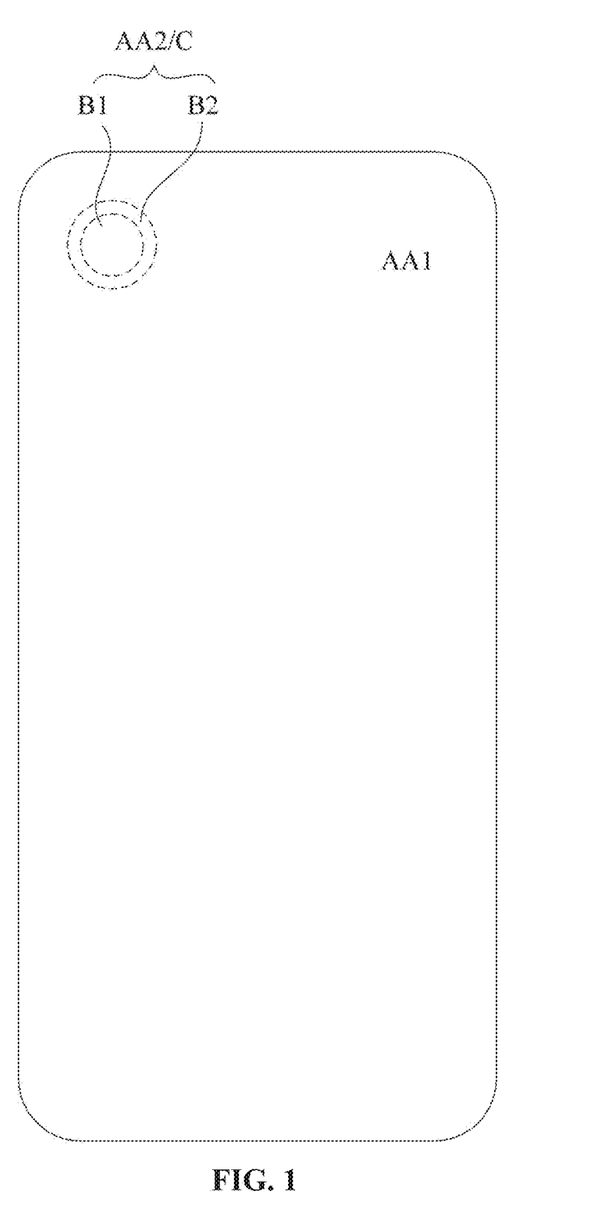
FIG. 1 is a top structural view of a display panel according to an embodiment of the present application.
Figure 2:
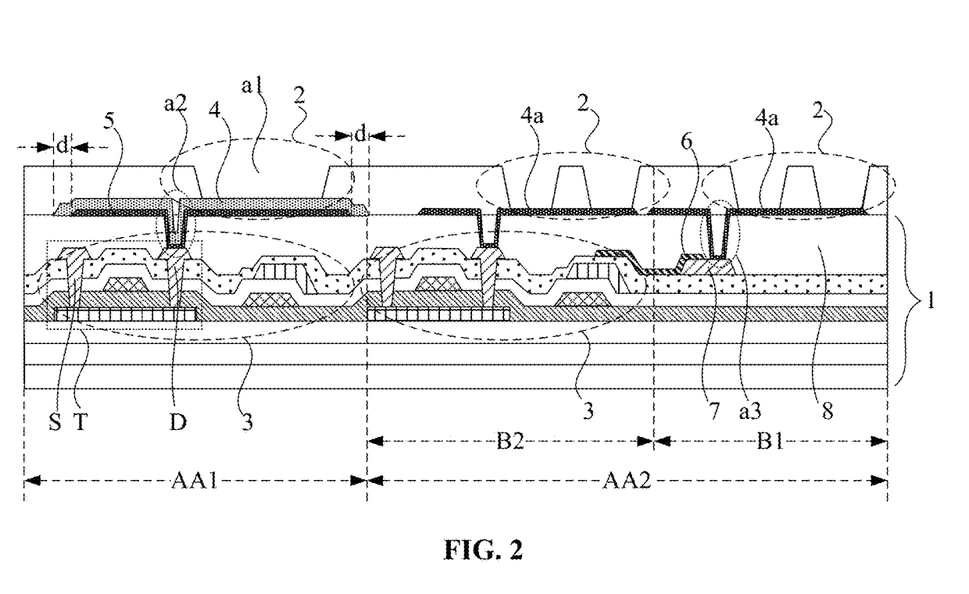
FIG. 2 is a sectional structural view of a display panel according to an embodiment of the present application.

FIG. 1 is a top structural view of a display panel according to an embodiment of the present application, and FIG. 2 is a sectional structural view of a display panel according to an embodiment of the present application. Referring to FIGS. 1 and 2, the display panel includes a first display region AA1 and a second display region AA2. The first display region AA1 is disposed around at least a portion of the second display region AA2. In FIG. 1, exemplarily, the first display region AA1 is disposed around the second display region AA2. The second display region AA2 is correspondingly provided with a photosensitive device, and the photosensitive device is configured to collect light through the second display region AA2. For example, the photosensitive device may be a photosensitive device such as a camera photosensitive device or a fingerprint recognition sensor. The second display region AA2 is the region disposed corresponding to the photosensitive device. The region can not only achieve the display function, but also has enough light transmission rate to ensure the accuracy of photosensitive recognition by the photosensitive device. The first display region AA1 is a normal display region in the display panel and is used to achieve the normal display of the region not provided with the photosensitive device. FIG. 1 only exemplarily shows the position of the second display region AA2 in the display panel, and the embodiments of the present application do not limit the position of the second display region AA2 in the display panel.

The display panel includes an array substrate 1 and a plurality of light-emitting structures 2 located on the array substrate 1 and disposed in the first display region AA1 and the second display region AA2. The light-emitting structures 2 may be organic light-emitting structures. The array substrate 1 is provided with a plurality of pixel driver circuits 3. The plurality of light-emitting structures 2 are disposed in one-to-one correspondence with the a plurality of pixel driver circuits 3. Each pixel driver circuit 3 provides a drive current to the corresponding light-emitting structure 2, the light-emitting structure 2 emits light in response to the drive current, and the display panel achieves the display function.

The display panel includes at least one isolation structure 5. Each isolation structure 5 is disposed in the first display region AA1 and located on a side, facing towards a corresponding pixel driver circuit 3, of an anode 4 of a corresponding one of at least one light-emitting structure 2 disposed in the first display region AA1, and an anode 4 of each of at least one light-emitting structure 2 is electrically connected to the corresponding pixel driver circuit 3 through a corresponding isolation structure 5. Each light-emitting structure 2 includes an anode 4, a cathode (not shown in FIG. 2) and a light-emitting functional layer (not shown in FIG. 2) located between the anode 4 and the cathode. The light-emitting functional layer is located on an opening region a1 of each light-emitting structure 2, that is, the region of the light-emitting structure 2 where light is actually emitted is the opening region a1 of the light-emitting structure 2. In the opening region a1 of each light-emitting structure 2, along a direction perpendicular to the display panel, the isolation structure 5 corresponding to the each light-emitting structure 2 covers the anode 4 of the each light-emitting structure 2, that is, the region where the isolation structure 5 is located covers the region where the anode 4 is located.

Referring to FIG. 1 and FIG. 2, the array substrate 1 further includes a planarization layer located between the pixel driver circuits 3 and the light-emitting structures 2. The planarization layer 8 is configured to provide a relatively flat production film layer for the formation of the light-emitting structures 2. To achieve full-screen display, the second display region AA2 correspondingly provided with the photosensitive device may also achieve the display function. To achieve the photosensitive function of the photosensitive device disposed corresponding to the second display region AA2, for example, to achieve the camera function or fingerprint recognition function, it is necessary to ensure that the second display region AA2 has sufficient light transmission rate. Therefore, at least a portion of the second display region AA2 needs to be formed with transparent electrodes 4a. For example, transparent anodes 4a of the second display region AA2 are formed on the planarization layer 8.

When the transparent anodes 4a are formed in the second display region AA2, the transparent anodes 4a are formed after the magnetron sputtering process and the etching process on the entire surface of the display panel. Then, the planarization layer 8 in the first display region AA1 will also be formed with the material of the transparent anodes 4a in the second display region AA2, and the sputtering film forming process for forming the transparent anodes 4a in the second display region AA2 will affect physical and chemical characteristics of the surface of the planarization layer 8 in the first display region AA1. As a result, when the anodes 4 in the first display region AA1 are deposited on the planarization layer 8, a migration phenomenon of the anodes 4 in the first display region AA1 exists. After the transparent anodes 4a are formed by etching, photoresist covering the transparent anodes 4a needs to be stripped, so that the planarization layer 8 is completely immersed in stripper. However, the planarization layer 8 itself is also a kind of photoresist, so that under the impact of the stripper, physical and chemical characteristics of the surface of the planarization layer 8 are changed, a migration phenomenon of the anodes 4 in the first display region AA1 exists when the anodes 4 in the first display panel AA1 are deposited on the planarization layer 8, and thus light emission characteristics of the light-emitting structures 2 in the first display region AA1 are affected. For example, the migration of the anodes 4 in the first display region AA1 will cause the color of the light emitted by the light-emitting structures 2 to become yellowish, thereby affecting the display effect of the first display region AA1 of the display panel.

Referring to FIGS. 1 and 2, in the embodiments of the present application, each isolation structure is disposed in the first display region AA1 and located on a side, facing towards a corresponding pixel driver circuit 3, of an anode 4 of a corresponding one of at least one light-emitting structure 2 disposed in the first display region AA1, and an anode 4 of each of at least one light-emitting structure 2 is electrically connected to the corresponding pixel driver circuit 3 through a corresponding isolation structure 5; and in an opening region a1 of the each of at least one light-emitting structure 2, the each isolation structure 5 covers the anode 4 of the corresponding one of at least one light-emitting structure 2 along the direction perpendicular to the display panel. In this way, the opening regions a1 of the light-emitting structures 2 achieve effective isolation between anodes 4 and the planarization layer 8 in the first display region AA1 through the isolation structures 5, and the problem is avoided that the manufacturing process of anodes 4 in the second display region AA2 causes the change of physical and chemical characteristics of the surface of the planarization layer 8 in the first display region AA1, thereby causing abnormal migration of anodes 4 in positions of the opening regions a1 of the light-emitting structures 2 and above the planarization layer 8. Further, the impact of the change of the physical and chemical characteristics of the surface of the planarization layer 8 in the first display region AA1 on light emission characteristics of the light-emitting structures 2 in the first display region AA1 is avoided, the light emission effect of the light-emitting structures 2 in the first display region AA1 is optimized, and thus the display effect of the first display region AA1 of the display panel is optimized.

Optionally, referring to FIG. 1 and FIG. 2, in the first display region AA1, an anode 4 is electrically connected to a corresponding pixel driver circuit 3 through a corresponding isolation structure 5 in a via hole a2, and in the via hole a2, each isolation structure 5 covers a corresponding anode 4 along the direction perpendicular to the display panel.

The array substrate 1 further includes the planarization layer 8 located between the pixel driver circuits 3 and the light-emitting structures 2. In the first display region AA1, the anode 4 is electrically connected to the isolation structure 5, and the isolation structure 5 is electrically connected to the corresponding pixel driver circuit 3 through a via hole a2 penetrating the planarization layer 8. In this way, the anode 4 of the light-emitting structure 2 in the first display region AA1 is electrically connected to the corresponding pixel driver circuit 3, and in the above-mentioned via hole a2, along the direction perpendicular to the display panel, the isolation structure 5 covers the corresponding anode 4. For example, a bottom of the via hole a2 and a sidewall of the via hole a2 are each provided with a corresponding isolation structure 5 and an anode 4 of a light-emitting structure 2 corresponding to the corresponding isolation structure. To achieve full-screen display, the second display region AA2 provided with the photosensitive device of the display panel may also achieve the display function. To achieve the photosensitive function of the photosensitive device disposed corresponding to the second display region AA2, it is necessary to ensure that the second display region AA2 has sufficient light transmission rate. Therefore, at least a portion of the second display region AA2 needs to be formed with transparent anodes 4a and corresponding transparent traces, and the transparent anodes 4a and the transparent traces of the second display region AA2 are both formed after the pixel driver circuits 3 are formed.

When the transparent anodes 4a and the transparent traces of the second display region AA2 are formed, the transparent anodes 4a and the transparent traces are all formed after magnetron sputtering and etching on the entire surface of the display panel. Then, source electrodes S or drain electrodes D of thin-film transistors T in the pixel driver circuits 3 of the first display region AA1 will also be formed with the material forming the transparent anodes 4a and the transparent traces in the second display region AA2, and the sputtering film forming process for forming the transparent anodes 4a and the transparent traces in the second display region AA2 will affect surface characteristics of the source electrodes S or the drain electrodes D of the thin-film transistors T in the pixel driver circuits 3 of the first display region AA1. For example, the film layer material of the source electrodes S or the drain electrodes D is Ti-Al-Ti, and thus the sputtering film forming process for forming the transparent anodes 4a and the transparent traces in the second display region AA2 will affect characteristics of the surface of the top layer Ti of the source electrodes S or the drain electrodes D of the thin-film transistors T in the pixel driver circuits 3 of the first display region AA1. As a result, when an anode 4 of a light-emitting structure 2 in the first display region AA1 is subsequently deposited in a via hole a2 to achieve electrical connection to a corresponding pixel driver circuit 3, the surface of the anode 4 in the via hole a2 has a relatively large surface roughness.

On the one hand, relatively large surface roughness of the anode 4 in the via hole a2 will leads to the relatively large lap resistance between the anode 4 in the via hole a2 and a source electrode S or a drain electrode D of a thin-film transistor T, thus affecting the signal transmission rate; in addition, the surface roughness of anodes 4 in different via holes a2 may vary greatly, resulting in a large difference in the relatively large lap resistance between anodes 4 in different via holes a2 and source electrode S or drain electrode D of thin-film transistor T, and affecting the display uniformity of the display panel. On the other hand, the anode 4 with a rough surface will cause serious diffuse reflection in the via hole a2, which affects light-emitting characteristics of the light-emitting structure 2, for example, the color of the light emitted by the light-emitting structure 2 becomes dark, and thus the display effect of the first display region AA1 of the display panel is affected.

Referring to FIGS. 1 and 2, in the embodiments of the present application, in the first display region AA1, an anode 4 is electrically connected to a corresponding pixel driver circuit 3 through a corresponding isolation structure 5 in a via hole a2, and in the via hole a2, each isolation structure 5 covers a corresponding anode 4 along the direction perpendicular to the display panel. In this way, the isolation structure 5 in the above-mentioned via hole a2 achieves effective isolation between the anode 4 and a source electrode S or a drain electrode D of a thin-film transistor T in a pixel driver circuit 3 in the first display region AA1, and the problem is avoided that the manufacturing process of the transparent anodes 4a and the transparent traces in the second display region AA2 causes the change of surface characteristics of source electrodes S or drain electrodes D of thin-film transistors T in the pixel driver circuits 3 of the first display region AA1, leading to a relatively large surface roughness of the anodes 4 in via holes a2, affecting the signal transmission rate and the display uniformity of the display panel, and affecting light emission characteristics of the light-emitting structures 2. Further, the lap resistance between the anodes 4 in via holes a2 and the source electrodes S or the drain electrodes D of the thin-film transistors T, the diffuse reflection phenomenon in the via holes a2 is weakened, the light-emitting effect of the light-emitting structures 2 in the first display region AA1 is optimized, and the display effect of the first display region AA1 of the display panel is further optimized. In FIG. 2, exemplarily, in the first display region AA1, the anode 4 of each light-emitting structure 2 is electrically connected to a drain electrode D of a thin-film transistor T in a corresponding pixel driver circuit 3, or the anode 4 of each light-emitting structure 2 is electrically connected to a source electrode S of a thin-film transistor T in a corresponding pixel driver circuit 3.

Optionally, referring to FIGS. 1 and 2, the isolation structures 5 may be manufactured in the same layer as anodes 4 of the light-emitting structures 2 disposed in the second display region AA2. Exemplarily, the material of the isolation structures 5 and the material of the anodes 4 of the light-emitting structures 2 disposed in the second display region AA2 include a transparent material. Optionally, the transparent material includes indium tin oxide, and the material of the anodes 4 of the light-emitting structures 2 disposed in the second display region AA2 includes a transparent material, so that the light transmission rate of the second display region AA2 of the display panel is improved, and the photosensitivity of the photosensitive device disposed in the second display region AA2 of the display panel is improved.

In the second display region AA2, the anodes 4 of the light-emitting structures 2 are formed on a side of the planarization layer 2 in the array substrate 1 away from the pixel driver circuits 3. The isolation structures 5 in the first display region AA1 are manufactured in the same layer as the anodes 4 of the light-emitting structures 2 in the second display region AA2, that is, the isolation structures 5 in the first display region AA1 are similarly formed on the side of the planarization layer 8 in the array substrate 1 away from the pixel driver circuits 3, so that each isolation structure in the first display region AA1 covers the region where the opening region a1 of a corresponding light-emitting structure 2 is located and covers the region where a via hole a2 exposing a source electrode S or a drain electrode D of a thin-film transistor T in the first display region AA1 is located. Then, an anode 4 of a light-emitting structure 2 is formed on the each isolation structure of the first display region AA1, the anode 4 of the light-emitting structure 2 is disposed in contact with the corresponding isolation structure 5, so that the anode 4 is electrically connected to the corresponding pixel driver circuits 3. In this way, the change of physical and chemical characteristics of the surface of the planarization layer 8 in the first display region AA1 is prevented from affecting light emission characteristics of the light-emitting structures 2 in the first display region AA1, the lap resistance between the anodes 4 in via holes 2 and source electrodes S or drain electrodes D of thin-film transistors T, the diffuse reflection phenomenon in the via holes a2 is weakened, the light-emitting effect of the light-emitting structures 2 in the first display region AA1 is optimized, and the manufacturing process of the display panel is simplified.

Optionally, referring to FIGS. 1 and 2, the second display region AA2 includes a transparent region B1 and a transition region B2. Exemplarily, the first display region AA1 may be disposed around the second display region AA2, the transition region B2 in the second display region AA2 is disposed around the transparent region B1 in the second display region AA2. The light-emitting structures 2 disposed in the second display region AA2 are disposed in the transparent region B1 and the transition region B2, that is, the transparent region B1 and the transition region B2 of the second display region AA2 both can achieve the display function. A first part pixel driver circuits 3 and a second part pixel driver circuits 3 are both disposed on the transition region B2, the first part pixel driver circuits 3 correspond to a first part light-emitting structures 2 disposed in the transparent region B1, and the second part pixel driver circuits 3 correspond to a second part light-emitting structures 2 disposed in the transition region B2, and each of anodes 4 of the first part light-emitting structures 2 is electrically connected to, through an anode trace 6, a corresponding one of the first and second pixel driver circuits 3.

The photosensitive device is disposed corresponding to the transparent region B1 of the second display region AA2 of the display panel. The transparent region B1 of the second display region AA2 is not provided with pixel driver circuits 3 that may shield light, so that the light transmission rate of the second display region AA2 is relatively high. The photosensitive device is disposed corresponding to the transparent region B1 of the second display region AA2, which is beneficial to improve the photosensitivity of the photosensitive device. The pixel driver circuits 3 disposed in the transition region B2 not only provide drive currents to corresponding light-emitting structures 2 in the transition region B2, but also provide drive currents to corresponding light-emitting structures 2 in the transparent region B1. That is, pixel driver circuits 3 corresponding to the light-emitting structures 2 disposed in the transition region B2 and pixel driver circuits 3 corresponding to the light-emitting structures 2 disposed in the transparent region B1 are all disposed in the transition region B2, thus an anode trace 6 is required to achieve the electrical connection between each of anodes 4 of the light-emitting structures 2 disposed in the transparent region B1 and a corresponding pixel driver circuit 3 disposed in the transition region B2. Then, the anodes 4 in the transparent region B1 receive drive currents provided by the corresponding pixel driver circuits 3 disposed in the transition region B2 to achieve the display function of the transparent region B1.

Optionally, referring to FIGS. 1 and 2, contacting structures 7 are disposed in the transparent region B1. The contacting structures 7 are manufactured in the same layer as source electrodes and drain electrodes (that is, the source electrodes S and the drain electrodes D of the thin-film transistors) of thin-film transistors T in the pixel driver circuits 3, and an anode 4 disposed in the transparent region B1 is electrically connected to a corresponding contacting structure 7 through a via hole a3. Each light-emitting structure 2 disposed in the transparent region B1 is electrically connected to a corresponding pixel driver circuit 3 disposed in the transition region B2 through the anode trace 6 which is lapped on the corresponding contacting structure 7 and is wired to the transition region B2.

As the resolution of the display panel increases, the number of light-emitting structures 2 in the first display region AA1 and the number of light-emitting structures 2 in the second display region AA2 of the display panel increase, and the number of light-emitting structures 2 in the transparent region B1 of the second display region AA2 also increases, that is, anodes 4 in the transparent region B1 are arranged more and more closely. However, the anode 4 of each light-emitting structure 2 in the transparent region B1 needs to be electrically connected to a corresponding pixel driver circuit 3 in the transition region B2, so that it is difficult to leave extra space for the anode 4 in the film layer where the anodes 4 of the transparent region B1 are located to be wired to the transition region B2 and electrically connected to the corresponding pixel driver circuit 3. To solve this problem, a corresponding anode trace 6 may be disposed in other film layers of the transparent region B1 to connect each anode 4 in the transparent region B1 and a corresponding pixel driver circuit 3 in the transition region B2.

In the embodiments of the present application, contacting structures 7 are disposed in the second display region AA2, an anode 4 disposed in the second display region AA2 is electrically connected to a corresponding contacting structure 7 through a via hole a3, and an anode trace 6 is lapped on the contacting structure 7 and is wired to the transition region B2 to be electrically connected to a corresponding pixel driver circuit 3. The contacting structures 7 may be manufactured in the same layer as source electrodes and drain electrodes of thin-film transistors T in the pixel driver circuits 3, that is, the anode 4 of a light-emitting structure 2 in the transparent region B1 is first connected to a contacting structure 7 manufactured in the same layer as the source electrodes S and the drain electrodes D of the thin-film transistors T through a via hole a3 penetrating the planarization layer 8; the anode trace 6 is lapped on the contacting structure 7, that is, the anode trace 6 is electrically connected to the contacting structure 7, and the anode trace 6 is wired to the transition region B2 to be electrically connected to the corresponding pixel driver circuit 3 in the transition region B2; therefore, it is achieved that the anode 4 in the transparent region B1 is electrically connected to the corresponding pixel driver circuit 3 in the transition region B2.

Exemplarily, the material of the anode trace 6 includes a transparent material. Optionally, the transparent material includes indium tin oxide. The anode trace 6 is at least partially located in the transparent region B1. The material of the anode trace 6 includes a transparent material, so that the light transmission rate of the transparent region B1 of the second display region AA2 of the display panel is improved, and the photosensitivity of the photosensitive device disposed corresponding to the transparent region B1 of the second display region AA2 of the display panel is improved. The contacting structures 7 are manufactured in the same layer as the source electrodes S or the drain electrodes D of the thin-film transistors T in the pixel driver circuits 3, so that the manufacturing process of the display panel is simplified, and at the same time, the resistance when the contacting structures 7 are provided is smaller than the resistance when no contacting structure is provided and the anode 4 in the transparent region B1 is directly connected to the anode trace 6. In this way, the impedance of the electrical connection line between the anode 4 and the anode trace 6 in the transparent region B1 is reduced, and the signal transmission rate of the above-mentioned electrical connection line is improved.

Figure 3:
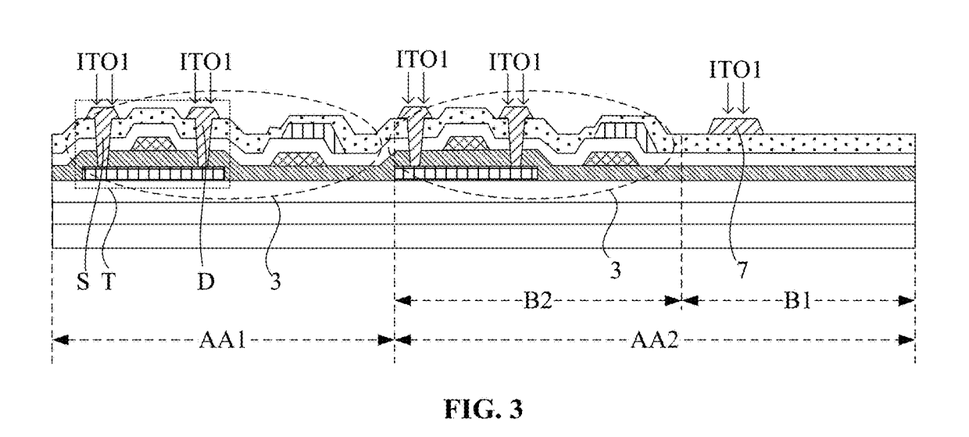
FIG. 3 is a sectional structural view of a display panel during a formation process of an anode trace according to an embodiment of the present application.
Figure 4:
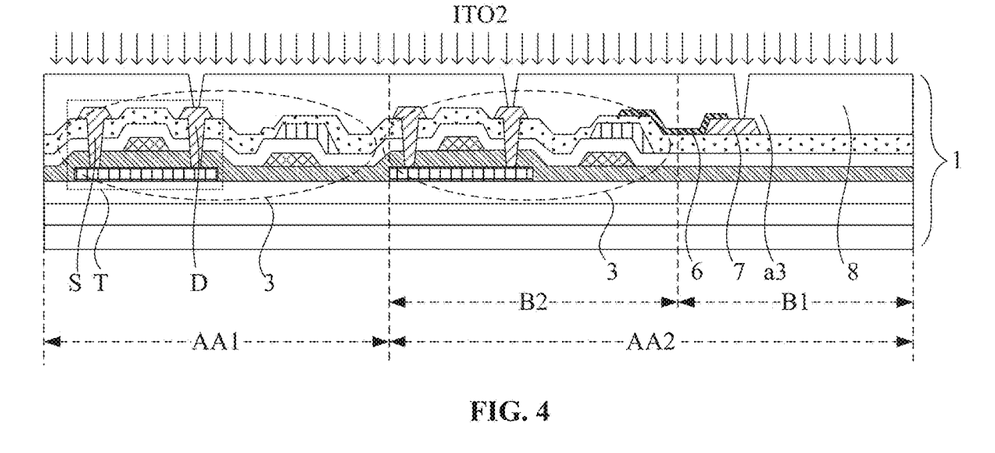
FIG. 4 is a sectional structural view of a display panel before an anode of a transparent region form according to an embodiment of the present application.

FIG. 3 is a sectional structural view of a display panel during a formation process of an anode trace according to an embodiment of the present application, and FIG. 4 is a sectional structural view of a display panel before an anode of a transparent region B1 form according to an embodiment of the present application. Referring to FIGS. 1 and 3, the anode trace 6 is formed after the source electrodes S and the drain electrodes D of the thin-film transistors T in the pixel driver circuits 3 are formed. The anode trace 6 is formed by sputtering indium tin oxide (ITO) material, and ITO1 in FIG. 3 represents the material of the anode trace 6 formed by sputtering. Since the anode trace 6 needs to be formed after magnetron sputtering and etching on the entire surface of the entire display panel, the source electrodes S or the drain electrodes D of the thin-film transistors T in the pixel driver transistors 3 of the first display region AA1 will also be form with the material of the anode trace 6 in the second display region AA2, and the sputtering film forming process for forming the anode trace 6 will affect surface characteristics of the source electrodes S or the drain electrodes D of the thin-film transistors T in the pixel driver circuits 3 of the first display region AA1.

Referring to FIGS. 1, 2 and 4, the anodes 4 of the second display region AA2 are formed after the planarization layer 8 in the array substrate 1 is formed and are formed after corresponding thin-film transistors T are formed with via holes for exposing source electrodes S or drain electrodes D of the thin-film transistors T. The anodes 4 of the second display region AA2 are formed by sputtering the ITO material, and ITO2 in FIG. 4 represents the material of the anodes 4 in the second display region AA2 formed by sputtering. Similarly, since the anodes 4 of the second display region AA2 need to be formed after magnetron sputtering and etching on the entire surface of the entire display panel, the source electrodes S or the drain electrodes D of the thin-film transistors T in the pixel driver transistors 3 of the first display region AA1 will also be form with the material of the anodes 4 in the second display region AA2, and the sputtering film forming process for forming the anodes 4 will affect surface characteristics of the source electrodes S or the drain electrodes D of the thin-film transistors T in the pixel driver circuits 3 of the first display region AA1. As a result, when the anode 4 of a light-emitting structure 2 in the first display region AA1 is subsequently deposited in a via hole a2 to achieve electrical connection to a corresponding pixel driver circuit 3, the surface of the anode 4 in the via hole a2 has a relatively large surface roughness, thus the signal transmission rate and the display uniformity of the display panel are affected, and light emission characteristics of the light-emitting structure 2 are affected.

In the embodiments of the present application, in the first display region AA1, an anode 4 is electrically connected to a corresponding pixel driver circuit 3 through a corresponding isolation structure 5 in a via hole a2, and in the via hole a2, each isolation structure 5 covers a corresponding anode 4 along the direction perpendicular to the display panel. In this way, the isolation structure in the above-mentioned via hole a2 achieves effective isolation between the anode 4 in the first display region AA1 and a source electrode or a drain electrode of a thin-film transistor T in a pixel driver circuit 3, the lap resistance between the anode 4 in the via hole 2 and the source electrode or the drain electrode of the thin-film transistor T, the diffuse reflection phenomenon in the via hole a2 is weakened, the light-emitting effect of the light-emitting structure 2 in the first display region AA1 is optimized, and the manufacturing process of the display panel is simplified.

Referring to FIGS. 1, 2 and 4, the anodes 4 of the second display region AA2 are formed after the planarization layer 8 in the array substrate 1 is formed and are formed after corresponding thin-film transistors T are formed with via holes for exposing source electrodes S or drain electrodes D of the thin-film transistors T. The formation of the anodes 4 in the second display region AA2 also leads to the material of the anodes 4 in the second display region AA2 forming on the planarization layer 8 in the first display region AA1, and the sputtering film forming process for forming the anodes 4 of the second display region AA2 will affect physical and chemical characteristics of the planarization layer 8 in the first display region AA1. As a result, when the anode 4 of a light-emitting structure 2 in the first display region AA1 is subsequently deposited in a via hole a2, migration of the anodes 4 in the first display region AA1 exists, which affects light emission characteristics of the light-emitting structures 2 in the first display region AA1 and thus affects the display effect of the first display region AA1 of the display panel.

In the embodiments of the present application, each isolation structure 5 is disposed in the first display region AA1 and located on a side, facing towards a corresponding pixel driver circuit 3, of an anode 4 of a corresponding one of at least one light-emitting structure 2 disposed in the first display region AA1, and an anode 4 of each of at least one light-emitting structure 2 is electrically connected to the corresponding pixel driver circuit 3 through a corresponding isolation structure 5; and in an opening region a1 of the each of at least one light-emitting structure 2, the each isolation structure 5 covers the anode 4 of the corresponding one of at least one light-emitting structure 2 along the direction perpendicular to the display panel. In this way, opening regions a1 of the light-emitting structures 2 achieve effective isolation between anodes 4 and the planarization layer 8 in the first display region AA1 through the isolation structures 5, the light emission effect of the light-emitting structures 2 in the first display region AA1 is optimized, and thus the display effect of the first display region AA1 of the display panel is optimized.

Optionally, referring to FIGS. 1 and 2, the thickness of the isolation structures 5 may be greater than or equal to 320 angstroms and be less than or equal to 400 angstroms. Considering the resistance of electrical connection lines between the anodes 4 of the light emitting structures 2 in the first display region AA1 and corresponding pixel driver circuits 3 and to accommodate the thickness of the isolation structures 5 manufactured in the same layer as the anodes 4 in the second display region AA2 and the thickness of the anodes 4 in the second display region AA2, the thickness of the isolation structures 5 is greater than or equal to 320 angstroms and is less than or equal to 400 angstroms.

Optionally, referring to FIGS. 1 and 2, along a direction parallel to the display panel, in the first display region AA1, an edge d of the anode 4 is 0.6 microns longer than or equal to an edge of the corresponding isolation structure 5, or is 1.2 microns less than or equal to the edge of the corresponding isolation structure 5. Exemplarily, the film structure of an anode 4 in the first display region AA1 may be an ITO/Argentum (Ag)/ITO film structure. Therefore, wet etching is adopted to pattern the anode 4 in the first display region AA1. During the process of wet etching the anode 4 in the first display region AA1, a phenomenon that the anode 4 in the first display region AA1 shrinks inward along the direction parallel to the display panel may exist. The structure that really affects characteristics of the light-emitting structure 2 in the first display region AA1 and the signal transmission of the anode 4 is the portion where the anode 4 of the light-emitting structure 2 in the first display region AA1 disposed along the direction perpendicular to the display panel and corresponding to the opening region a1 in the first display region AA1 overlapping a corresponding isolation structure 5. Therefore, the edge of the anode 4 in the first display region AA1 is 0.6 microns longer than or equal to the edge of the corresponding isolation structure 5, or is 1.2 microns less than or equal to the edge of the corresponding isolation structure 5, that is, a margin greater than or equal to 0.6 microns or less than or equal to 1.2 microns is left for the inward shrinkage of the anode 4 in the first display region AA1, so that even if the anode 4 in the first display region AA1 shrinks inward, the corresponding opening region a1 in the first display region AA1 is still provided with the anode 4 of the light-emitting structure 2 in the first display region AA1 overlapping the corresponding isolation structure 5, and light emission characteristics of the light-emitting structure 2 are optimized.

Figure 5:
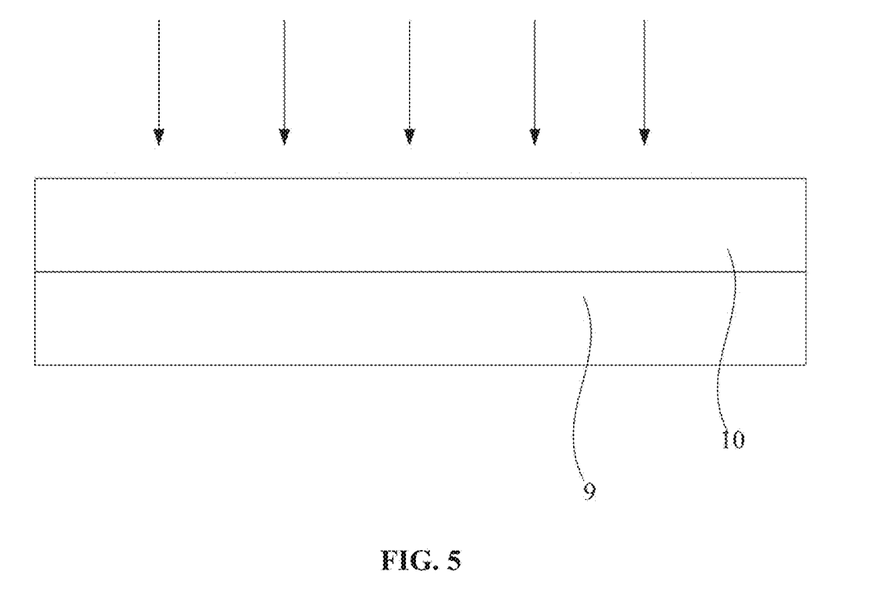
FIG. 5 is a sectional structural view of a display apparatus according to an embodiment of the present application.

The embodiments of the present application further provide a display apparatus. FIG. 5 is a sectional structural view of a display apparatus according to an embodiment of the present application. As shown in FIG. 1, the display apparatus includes the display panel 10 described in the above embodiments. The display apparatus may further include a device body 9, the display panel 10 covers the device body 9 and is connected to the device body 9. Arrows in FIG. 5 indicate the incident direction of external light.

Referring to FIGS. 1 and 5, the display body 9 in the display apparatus has a device region C. The device region C is located below the second display region AA2 of the display panel 10. More accurately, the device region C is located below the transparent region B1 of the second display region AA2 of the display panel 10. The device region C is provided with the photosensitive device configured to collect light through the second display region AA2. The photosensitive device may be a photosensitive device such as a camera and a light sensor, which can perform operations such as collecting external light through the second display region AA2. Exemplarily, the display apparatus may be a digital apparatus such as a mobile phone, a tablet, a palmtop computer, or an internet portable audio device like an iPod.

What is claimed is:

1. A display panel, comprising:
a first display region and a second display region, wherein the first display region is disposed around at least a portion of the second display region, the second display region corresponds to a photosensitive device configured to collect light through the second display region, the second display region comprises a transparent region and a transition region, and a plurality of contacting structures is disposed in the transparent region;
an array substrate;
a plurality of light-emitting structures located on the array substrate and disposed in both the first display region and the second display region, wherein each of the plurality of light-emitting structures comprises an anode and an opening region;

a plurality of pixel driver circuits disposed in the array substrate and disposed in one-to-one correspondence with the plurality of light-emitting structures; and at least one isolation structure disposed in the first display region, wherein each of the at least one isolation structure is disposed and connected between the anode of a corresponding one of the plurality of light-emitting structures and a corresponding one of the plurality of pixel driver circuits, and, in the opening region of each of the plurality of light-emitting structures, each of the at least one isolation structure covers the anode of the corresponding one of the plurality of light-emitting structures along a first direction perpendicular to the display panel, a first part pixel driver circuits and a second part pixel driver circuits of the plurality of pixel driver circuits are both disposed on the transition region, the first part pixel driver circuits correspond to a first part light-emitting structures of the plurality of light-emitting structures disposed in the transparent region, the second part pixel driver circuits correspond to a second part light-emitting structures of the plurality of light-emitting structures disposed in the transition region, and the anodes of the first part light-emitting structures are electrically connected to corresponding ones of the first part pixel driver circuits and the second part pixel driver circuits via a plurality of anode traces.

2. The display panel according to claim 1, further comprising:
a planarization layer located between the plurality of light-emitting structures and the plurality of pixel driver circuits; and
a via hole running through the planarization layer, wherein in the first display region, in the via hole, each of the at least one isolation structure electrically connects the anode of the corresponding one of the plurality of light-emitting structures and the corresponding one of the plurality of pixel driver circuits, and each of the at least one isolation structure covers the anode of the corresponding one of the plurality of light-emitting structures along the first direction.

3. The display panel according to claim 2, wherein the at least one isolation structure and the anodes of the light-emitting structures are disposed in both a bottom of the via hole and a sidewall of the via hole.

4. The display panel according to claim 1, wherein the at least one isolation structure are manufactured in a same layer as anodes of the plurality of light-emitting structures disposed in the second display region.

5. The display panel according to claim 4, wherein a material of the at least one isolation structure and a material of the anodes of the plurality of light-emitting structures disposed in the second display region comprise a transparent material.

6. The display panel according to claim 5, wherein the transparent material comprises indium tin oxide.

7. The display panel according to claim 1, further comprising:
a planarization layer located between the plurality of light-emitting structures and the plurality of pixel driver circuits;
a via hole running through the planarization layer, wherein the plurality of contacting structures is manufactured in a same layer as source electrodes and drain electrodes of thin-film transistors in the plurality of pixel driver circuits, the anodes of the first part light-emitting structures are electrically connected to a corresponding one of the plurality of contacting structures via the via hole, and the plurality of anode traces is in contact with the plurality of contacting structures and extends to the transition region to be electrically connected to the first part pixel driver circuits.

8. The display panel according to claim 7, wherein a material of the plurality of anode traces comprises a transparent material.

9. The display panel according to claim 1, wherein a thickness of each of the at least one isolation structure is greater than or equal to 320 angstroms and is less than or equal to 400 angstroms.

10. The display panel according to claim 1, wherein along a second direction parallel to the display panel, in the first display region, a size of the anode of each of the plurality of light-emitting structures is 0.6 microns longer than or equal to a size of the corresponding one of the at least one isolation structure and is 1.2 microns less than or equal to the size of the corresponding one of the at least one isolation structure.

11. The display panel according to claim 1, wherein the second display region is entirely surrounded by the first display region.

12. The display panel according to claim 1, wherein the transparent region is surrounded by the transition region.

13. The display panel according to claim 1, wherein each of the plurality of light-emitting structures further comprises:
a cathode; and
a light-emitting functional layer located between the anode and the cathode.

14. The display panel according to claim 13, wherein each light-emitting functional layer is located on the opening region of the corresponding one of the plurality of light-emitting structures.

15. The display panel according to claim 1, wherein the anodes of the plurality of light-emitting structures are electrically connected to a plurality of drain electrodes of a plurality of thin-film transistors in the plurality of pixel driver circuits.

16. The display panel according to claim 1, wherein the anode of each of the plurality of light-emitting structures is electrically connected to a source electrode of a thin-film transistor in a corresponding one of the plurality of pixel driver circuits.

17. A display apparatus comprising the display panel of claim 1.

18. The display apparatus according to claim 17, further comprising:
a device body, wherein the display panel covers the device body and is connected to the device body, the device body has a device region that is located below a transparent region of the second display region of the display panel, the device region is provided with the photosensitive device, and the photosensitive device is configured to collect light through the second display region.

19. The display apparatus according to claim 18, wherein the photosensitive device comprises:
a camera photosensitive device; or
a fingerprint recognition sensor.

* * * * *